(12) United States Patent
Junhua et al.

(10) Patent No.: US 6,949,869 B2
(45) Date of Patent: Sep. 27, 2005

(54) PIEZOELECTRIC ACTUATOR, LIQUID JETTING HEAD INCORPORATING THE SAME, PIEZOELECTRIC ELEMENT, AND METHOD OF MANUFACTURING THE SAME

(75) Inventors: Chang Junhua, Nagano (JP); Takahiro Katakura, Nagano (JP); Motonori Okumura, Nagano (JP)

(73) Assignee: Seiko Epson Corporation, Shinjuku-ku (JP)

( * ) Notice: Subject to any disclaimer, the term of this patent is extended or adjusted under 35 U.S.C. 154(b) by 66 days.

(21) Appl. No.: 10/388,591

(22) Filed: Mar. 17, 2003

(65) Prior Publication Data

US 2004/0004413 A1 Jan. 8, 2004

(30) Foreign Application Priority Data

| Mar. 18, 2002 | (JP) | ................................. P2002-075089 |
| Mar. 18, 2002 | (JP) | ................................. P2002-075091 |
| May 29, 2002 | (JP) | ................................. P2002-156153 |
| Mar. 14, 2003 | (JP) | ................................. P2003-070545 |

(51) Int. Cl.$^7$ ............................. H02N 2/00; H01L 41/08
(52) U.S. Cl. ...................... 310/328; 310/365; 310/366
(58) Field of Search .............................. 310/328, 365, 310/366

(56) References Cited

U.S. PATENT DOCUMENTS

| 5,706,820 | A | * | 1/1998 | Hossack et al. ............ 600/459 |
| 6,347,441 | B1 | * | 2/2002 | Yun et al. .................... 310/328 |
| 6,504,287 | B2 | | 1/2003 | Yun et al. .................... 310/328 |

FOREIGN PATENT DOCUMENTS

| CN | 1338377 A | 3/2002 | |
| EP | 0 803 918 A1 | 10/1997 | ............ H01L/41/08 |
| EP | 0 930 165 A1 | 7/1999 | ............ B41J/2/045 |
| EP | 0 969 530 A2 | 1/2000 | ............ H01L/41/22 |
| JP | 2-289352 | 11/1990 | ............ B41J/2/045 |
| JP | 3-128681 | 5/1991 | ............ H02N/2/00 |
| JP | 9-277531 | 10/1997 | ............ B41J/2/045 |
| JP | 9-323410 | 12/1997 | ............ B41J/2/045 |
| JP | 10-34924 | 2/1998 | ............ B41J/2/045 |
| JP | 11-5305 | 1/1999 | ............ B41J/2/045 |
| JP | 2000-77438 | 3/2000 | ............ H01L/21/52 |
| JP | 2000-141647 | 5/2000 | ............ B41J/2/045 |
| JP | 2000-332313 | 11/2000 | ............ H01L/41/09 |
| JP | 2001-077438 | 3/2001 | ............ B41J/2/045 |
| WO | WO 01/75985 A1 | 10/2001 | ............ H01L/41/08 |
| WO | WO 02/073710 A1 | 9/2002 | ......... H01L/41/083 |

\* cited by examiner

Primary Examiner—Darren Schuberg
Assistant Examiner—J. Aguirrechea
(74) Attorney, Agent, or Firm—Sughrue Mion, PLLC

(57) ABSTRACT

A substrate is formed with a chamber having an opening which is defined by first edges extending in a first direction with a first dimension and second edges extending in a second direction perpendicular to the first direction with a second dimension shorter than the first dimension. A vibration plate is provided on the substrate so as to seal the opening. A first common electrode to be fixed at a predetermined potential is formed on the vibration plate. A first piezoelectric layer is laminated on the first common electrode so as to oppose the chamber. The first piezoelectric layer extends in the first direction such that both end portions thereof in the first direction are beyond the second edges of the opening. A drive electrode to which a drive signal is supplied externally is laminated on the first piezoelectric layer. A second piezoelectric layer is laminated on the drive electrode so as to oppose the chamber. The second piezoelectric layer extends in the first direction such that both end portions thereof in the first direction are beyond the second edges of the opening. A second common electrode to be fixed at the predetermined potential is laminated on the second piezoelectric layer.

16 Claims, 9 Drawing Sheets

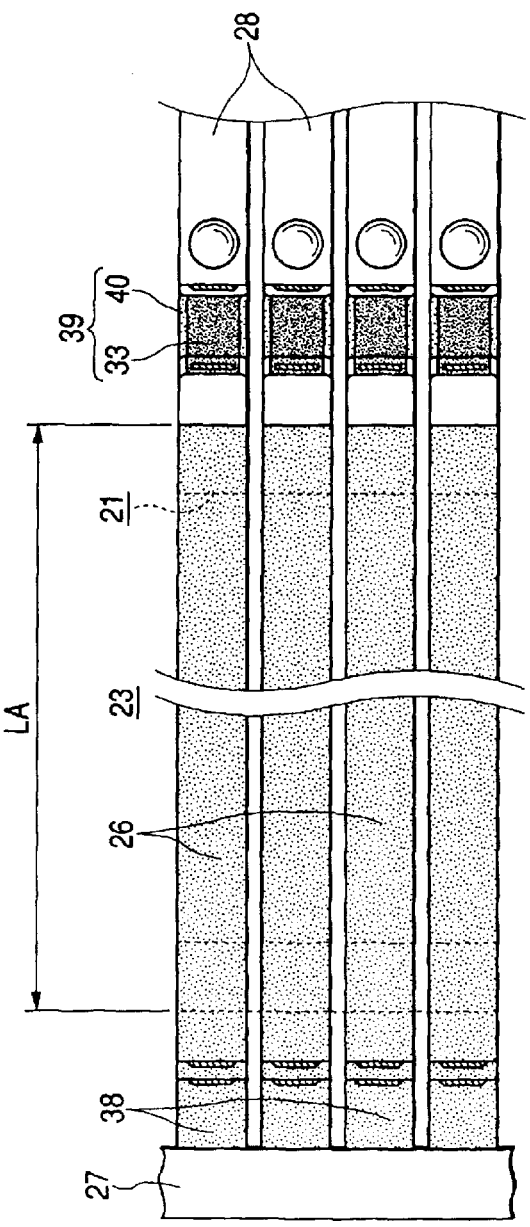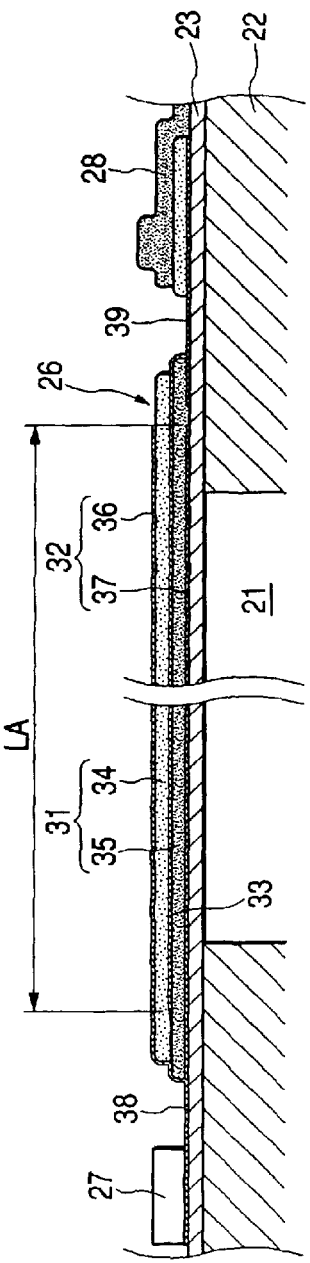

PIEZOELECTRIC ACTUATOR, LIQUID JETTING HEAD INCORPORATING THE SAME, PIEZOELECTRIC ELEMENT, AND METHOD OF MANUFACTURING THE SAME

BACKGROUND OF THE INVENTION

This invention relates to a piezoelectric actuator using, as a driving source, a piezoelectric element to be deformed by the supply of a driving signal, a liquid jetting head comprising such a piezoelectric actuator, a method of manufacturing the piezoelectric element.

A piezoelectric actuator is a member for using a piezoelectric element as a driving source and flexing a vibration plate to change the volume of a pressure chamber by the deformation of the piezoelectric element, and is suitably utilized as a liquid jetting head or a member of a micropump, for example. Here, the piezoelectric element comprised of a piezoelectric material which shows a piezoelectric effect, such as a piezoelectric ceramics made by compressing and baking metal oxide powder (e.g., $BaTiO_3$, $PbZrO_3$, $PbTiO_3$), a piezoelectric polymer film using polymer compound. The liquid jetting head serves to eject a liquid droplet from a nozzle orifice, and includes a recording head to be used in an image recording apparatus such as a printer, a liquid crystal jetting head to be used for manufacturing a liquid crystal display, and a coloring material jetting head to be used for manufacturing a color filter, for example. Moreover, the micropump is a microminiaturized pump capable of treating a very small amount of liquid.

The vibration plate is a very thin member having a thickness of approximately 5 to 6 μm, and the piezoelectric element has a single layer structure which has been used practically, and has a thickness of approximately 15 μm. Accordingly, the total thickness of the vibration plate and the piezoelectric element is approximately 20 μm. For this reason, the compliance of a deformed portion in a pressure chamber, that is, the compliance of the vibration plate and the piezoelectric element becomes large. Consequently, there is a possibility that a volume might be changed with a slight variation in liquid pressure present in the pressure chamber. Moreover, if the compliance of the deformed portion is large, the responsibility of the piezoelectric element (the responsibility of the deformation) for a supplied driving signal is deteriorated so that high frequency driving is hard to perform.

It can be supposed that the thickness of the piezoelectric element is set to be larger in order to reduce the compliance of the deformed portion. If the thickness is simply increased, a driving voltage is to be raised correspondingly and is not suitable for the high frequency driving. Moreover, the deformed portion is hard to flex. Consequently, the amount of a pressure fluctuation of the liquid becomes insufficient.

Therefore, it is supposed that a piezoelectric element having a multilayer structure disclosed in Japanese Patent Publication No. 2-289352A and Japanese Patent Publication No. 10-34924A is used. In the piezoelectric element, a piezoelectric layer has a two-layer structure having an upper piezoelectric layer and a lower piezoelectric layer and a drive electrode is formed on a boundary between the upper piezoelectric layer and the lower piezoelectric layer, and furthermore, an upper common electrode is formed on the outer surface of the upper piezoelectric layer and a lower common electrode is formed on the outer surface of the lower piezoelectric layer.

The piezoelectric element has the drive electrode provided on the boundary between the upper piezoelectric layer and the lower piezoelectric layer. For this reason, an electric field having an intensity determined by a distance from the drive electrode to each common electrode (the thickness of each piezoelectric layer) and a potential difference between the drive electrode and each common electrode is given to the piezoelectric element of each layer. As compared with a conventional piezoelectric element having a single layer structure including a single piezoelectric layer interposed between the common electrode and the drive electrode, that is, a piezoelectric element used practically, therefore, the piezoelectric element can be deformed largely at the same driving voltage as that in the conventional element even if the thickness of the whole piezoelectric element is slightly increased to enhance a rigidity.

However, it is hard to obtain desirable characteristics by simply using the piezoelectric element having the multilayer structure described in each publication. For example, the ejecting characteristic or feeding characteristic of liquid is varied or a balance between the high frequency driving of the piezoelectric element and the ejecting amount (feeding amount) of the liquid cannot be taken. Moreover, there is also a problem in that a disconnection is apt to be caused on an electrode. For this reason, a piezoelectric element having a single layer structure including a single piezoelectric layer interposed between a common electrode and a drive electrode is inevitably used as an actual product.

SUMMARY OF THE INVENTION

It is therefore an object of the invention to provide a piezoelectric actuator, in which the ejecting (feeding) characteristic of liquid can be stabilized. It is also an object of the invention to provide a piezoelectric actuator, in which a necessary ejecting amount (feeding amount) can be obtained while carrying out high frequency driving. Furthermore, it is also an object of the invention to provide a piezoelectric actuator, in which reliability and a yield in manufacture can be improved.

In order to achieve the above objects, according to the invention, there is provided a piezoelectric actuator, comprising:

a substrate, formed with a chamber having an opening which is defined by first edges extending in a first direction with a first dimension and second edges extending in a second direction perpendicular to the first direction with a second dimension shorter than the first dimension;

a vibration plate, provided on the substrate so as to seal the opening;

a first common electrode, formed on the vibration plate and to be fixed at a predetermined potential;

a first piezoelectric layer, laminated on the first common electrode so as to oppose the chamber, the first piezoelectric layer extending in the first direction such that both end portions thereof in the first direction are beyond the second edges of the opening;

a drive electrode, laminated on the first piezoelectric layer, to which a drive signal is supplied externally;

a second piezoelectric layer, laminated on the drive electrode so as to oppose the chamber, the second piezoelectric layer extending in the first direction such that both end portions thereof in the first direction are beyond the second edges of the opening; and a second common electrode, laminated on the second piezoelectric layer and to be fixed at the predetermined potential.

In such a configuration, it is possible to reduce the compliance of the deformed portion of the chamber constituted by the vibration plate and the piezoelectric element, thereby reliably suppressing a fluctuation in the volume of the chamber in a steady state. Consequently, the ejecting characteristic and the feeding characteristic of liquid can be stabilized. Since the compliance of the deformed portion can be reduced, moreover, the invention is also suitable for high frequency driving.

Furthermore, since the piezoelectric element has the multilayer structure, it is possible to increase a deformation efficiency. Consequently, it is possible to complement a decrease in the amount of deformation of the deformed portion which is caused by a reduction in the compliance. Accordingly, it is possible to eject or feed a necessary amount of liquid while carrying out high frequency driving.

It is preferable that: the first common electrode and the second common electrode are electrically connected at a first region situated outer than one of the second edges in the first direction; and a length in which the first piezoelectric layer extends beyond one of the second edges toward the first region is longer than a length in which the second piezoelectric layer extends beyond the one of the second edges toward the first region.

In such a configuration, the disconnection of the second common electrode can be prevented and a yield can be enhanced.

Furthermore, the first region can be formed at a portion not to be deformed so that the connecting reliability can be maintained for a long time period.

It is further preferable that one end face of the first piezoelectric layer situated outer than the one of the second edges and one end face of the second piezoelectric layer situated outer than the one of the second edges form a continuous slope.

According to the invention, there is also provided a piezoelectric actuator, comprising:

a substrate, formed with a chamber having an opening which is defined by first edges extending in a first direction with a first dimension and second edges extending in a second direction perpendicular to the first direction with a second dimension shorter than the first dimension;

a vibration plate, provided on the substrate so as to seal the opening;

a first common electrode, formed on-the vibration plate and to be fixed at a predetermined potential;

a first piezoelectric layer, laminated on the first common electrode so as to oppose the chamber;

a drive electrode, laminated on the first piezoelectric layer, to which a drive signal is supplied externally;

a second piezoelectric layer, laminated on the drive electrode so as to oppose the chamber, the second piezoelectric layer extending in the first direction such that each of end portions thereof in the first direction covers an associated end portion in the first direction of the first piezoelectric layer; and a second common electrode, laminated on the second piezoelectric layer and to be fixed at the predetermined potential.

In such a configuration, a step is hardly to be generated on the surface of the second piezoelectric layer on which the second common electrode is formed, so that the same surface can be provided smoothly. Consequently, the second common electrode can be provided uniformly and the generation of a defective portion can be prevented so that the reliability of manufacture can be enhanced.

Preferably, a thickness of each end portion in the first direction of the first piezoelectric layer is gradually reduced toward each end thereof.

Preferably, the first piezoelectric layer and the second piezoelectric layer extend in the first direction such that both end portions thereof in the first direction are beyond the second edges of the opening.

In the above configurations, it is preferable that the drive electrode extends in the first direction beyond one of the second edges.

Here, it is preferable that the piezoelectric actuator further comprises a connection electrode, formed on the vibration plate and electrically connected to the drive electrode at a portion where is outer than one of the second edges. The drive signal is supplied to the drive electrode via the connection electrode.

In such a configuration, since the connection electrode and the drive electrode are electrically connected at a portion not to be deformed, the disconnection can be avoided so that the connecting reliability can be maintained for a long time period.

It is further preferable that a part of the connection electrode is covered by the first piezoelectric layer.

It is also preferable that the first common electrode and the connection electrode are comprised of an identical conductive material.

In the above configurations, it is preferable that the drive electrode, and at least one of the first common electrode and the second common electrode extend in the first direction such that both end portions thereof in the first direction are at least up to the second edges of the opening.

In such a configuration, the whole of the vibration plate facing the opening can be deformed and a sufficient ejection amount (liquid feeding amount) can be secured.

In the above configurations, it is preferable that: a length in the second direction of the first piezoelectric layer is longer than a length in the second direction of the first common electrode; a length in the second direction of the second piezoelectric layer is longer than a length in the second direction of the drive electrode; and a thickness of each end portion in the second direction of at least one of the first piezoelectric layer and the second piezoelectric layer is thinner than a thickness of a center portion thereof in the second direction.

In such a configuration, a deformation efficiency in the deformed portion can be enhanced and a sufficient ejection amount (liquid feeding amount) can be secured.

In the above configurations, it is preferable that a plurality of piezoelectric elements each including the first common electrode, the first piezoelectric layer, the drive electrode, the second piezoelectric layer and the second common electrode are arranged in the second direction.

It is further preferable that the piezoelectric actuator further comprises a proximal common electrode extending in the second direction, to which the first common electrode and the second common electrode in each of the piezoelectric elements are electrically connected.

According to the invention, there is also provided a liquid jetting head, comprising the above piezoelectric actuator such that the vibration plate is deformed to cause pressure fluctuation in liquid contained in the chamber to eject a liquid droplet from a nozzle orifice communicated with the chamber.

According to the invention, there is also provided a piezoelectric element, comprising:

a first common electrode, to be fixed at a predetermined potential;

a first piezoelectric layer, laminated on the first common electrode and extending in a first direction;

a drive electrode, laminated on the first piezoelectric layer, to which a drive signal is supplied externally;

a second piezoelectric layer, laminated on the drive electrode and extending in the first direction such that each of end portions thereof in the first direction covers an associated end portion in the first direction of the first piezoelectric layer; and a second common electrode, laminated on the second piezoelectric layer and to be fixed at the predetermined potential.

Preferably, a thickness of each end portion in the first direction of the first piezoelectric layer is gradually reduced toward each end thereof.

According to the invention, there is also provided a method of manufacturing a piezoelectric element, comprising steps of:

providing a first electrode;

disposing a first mask on the first electrode, the first mask having an aperture extending in a first direction with a first dimension;

coating a piezoelectric material onto the first electrode through the first mask;

baking the coated piezoelectric material to form a first piezoelectric layer;

disposing a second mask on the first piezoelectric layer;

coating an electrode material onto the first piezoelectric layer through the second mask;

baking the coated electrode material to form a second electrode;

disposing a third mask on the second electrode, the third mask having an aperture extending in the first direction with a second dimension longer than the first dimension;

coating the piezoelectric material onto the second electrode through the third mask; and baking the coated piezoelectric material to form a second piezoelectric layer.

BRIEF DESCRIPTION OF THE DRAWINGS

The above objects and advantages of the present invention will become more apparent by describing in detail preferred exemplary embodiments thereof with reference to the accompanying drawings, wherein:

FIG. 5A is a plan view showing a piezoelectric element according to a first embodiment of the invention;

FIG. 5B is a section view showing the piezoelectric element along with a longitudinal direction thereof;

DETAILED DESCRIPTION OF THE PREFERRED EMBODIMENTS

Figure 1:
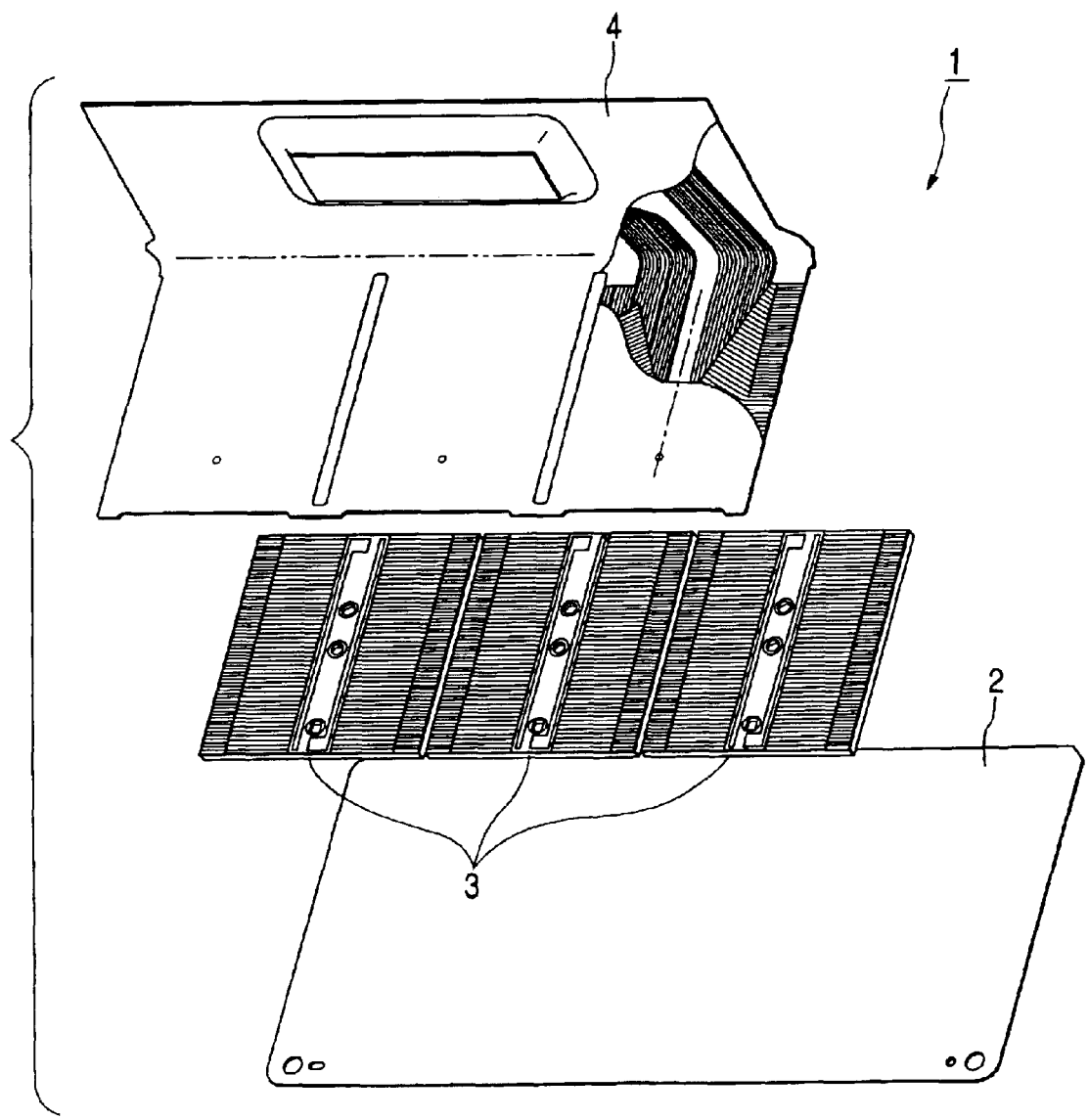
FIG. 1 is an exploded perspective view for explaining the structure of a recording head.

Preferred embodiments of the invention will be described below with reference to the accompanying drawings. Herein, description will be given by taking, as an example, a recording head (a kind of liquid jetting head) using a piezoelectric element. As shown in FIG. 1, a recording head 1 is schematically constituted by a flow passage unit 2, a plurality of actuator units 3, and a film-shaped wiring board 4. The actuator units 3 are bonded transversely to the surface of the flow passage unit 2, and the wiring board 4 is attached to the surface of the actuator unit 3 on the opposite side of the flow passage unit 2.

The flow passage unit 2 is constituted by a supply port formation substrate 7 provided with through holes to be a part of an ink supply port 5 and a nozzle communication port 6, a reservoir formation substrate 9 provided with a through hole to be a common ink reservoir 8 and a through hole to be a part of the nozzle communication port 6, and a nozzle plate 11 provided with a plurality of nozzle orifices 10. The supply port formation substrate 7, the reservoir formation substrate 9 and the nozzle plate 11 are fabricated by pressing a plate member formed of stainless, for example. In the embodiment, three actuator units 3 are bonded to one flow passage unit 2. Therefore, three sets of ink supply ports 5, nozzle communication ports 6, supply port formation substrates 7 and common ink reservoirs 8 are formed in total for respective actuator units 3.

The flow passage unit 2 has the nozzle plate 11 provided on one of the surfaces (the lower side in the drawing) of the reservoir formation substrate 9 and the supply port formation substrate 7 provided on the other surface (the upper side), and is fabricated by bonding the supply port formation substrate 7, the reservoir formation substrate 9 and the nozzle plate 11. For example, the flow passage unit 2 is fabricated by bonding each member with a sheet-shaped adhesive.

Figure 3:
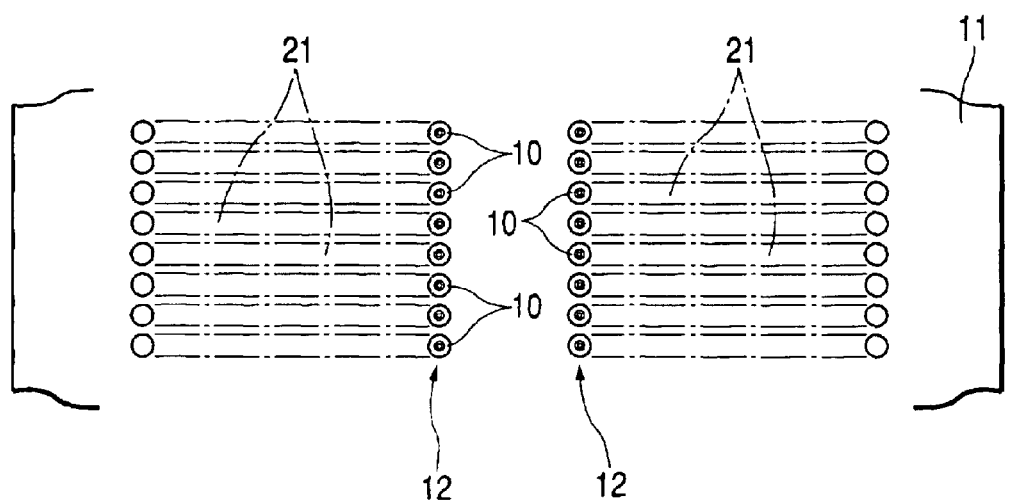
FIG. 3 is a partial enlarged view for explaining a nozzle plate.
Figure 4:
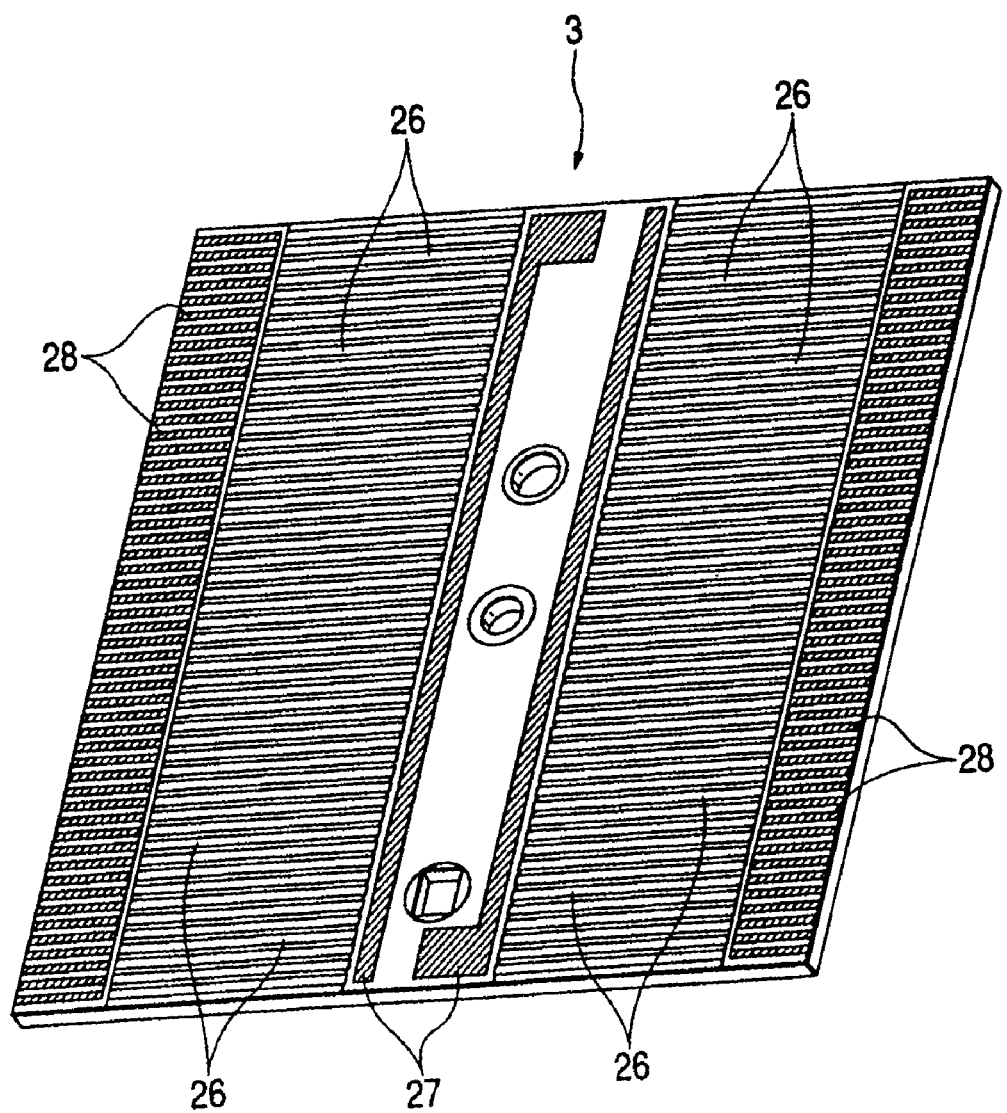
FIG. 4 is a perspective view showing the actuator unit seen from the piezoelectric element side.
Figure 6A:
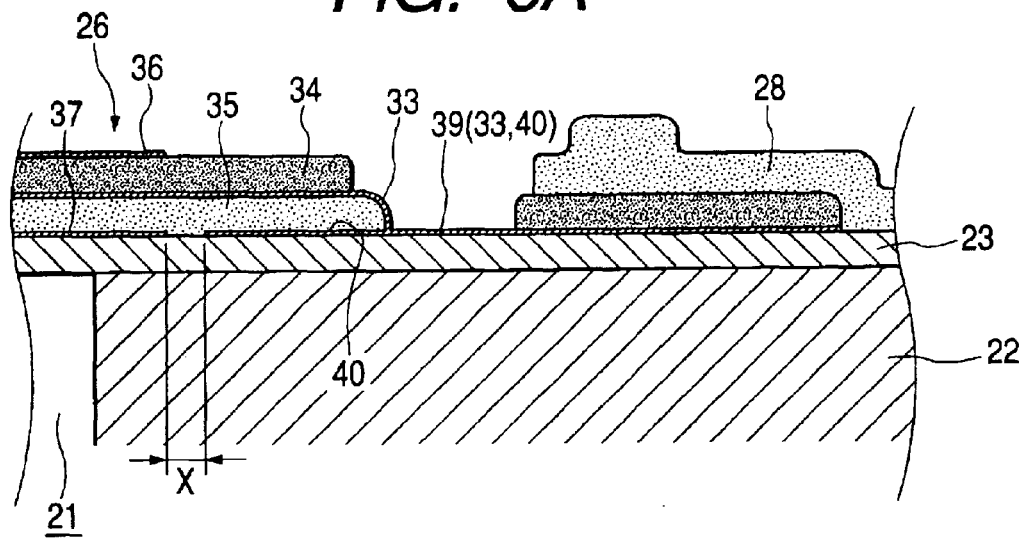
FIG. 6A is a partial enlarged section view showing the structure of the end of the piezoelectric element on a supply terminal side.
Figure 6B:
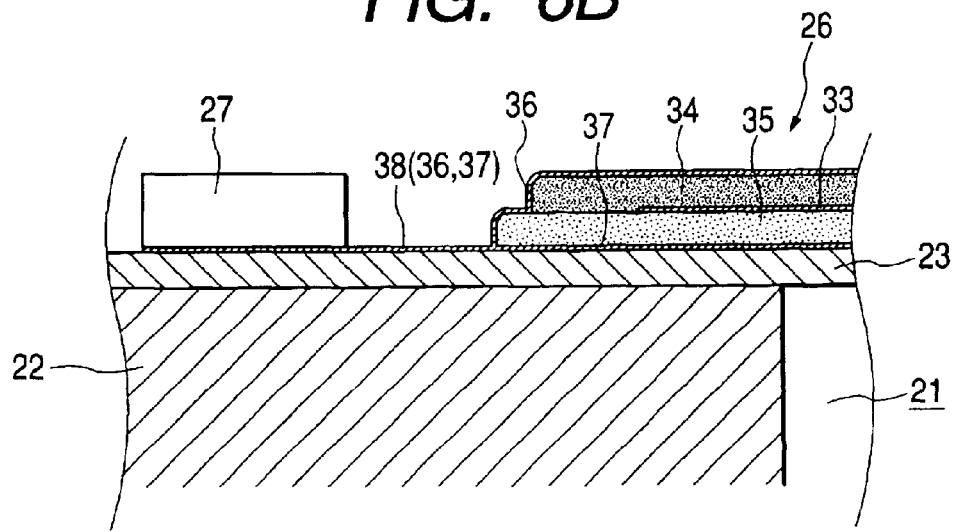
FIG. 6B is a partial enlarged section view showing the structure of the end of the piezoelectric element on a proximal common electrode side.

The nozzle orifices 10 are arranged so as to form a plurality of nozzle rows 12 at a predetermined pitch as shown in FIG. 3. For example, one nozzle row 12 is constituted by 92 nozzle orifices 10. Moreover, the nozzle row 12 is formed in two rows for one actuator unit 3. Since the recording head 1 according to the embodiment comprises three actuator units 3, six nozzle rows 12 are arranged laterally in total.

Figure 2:
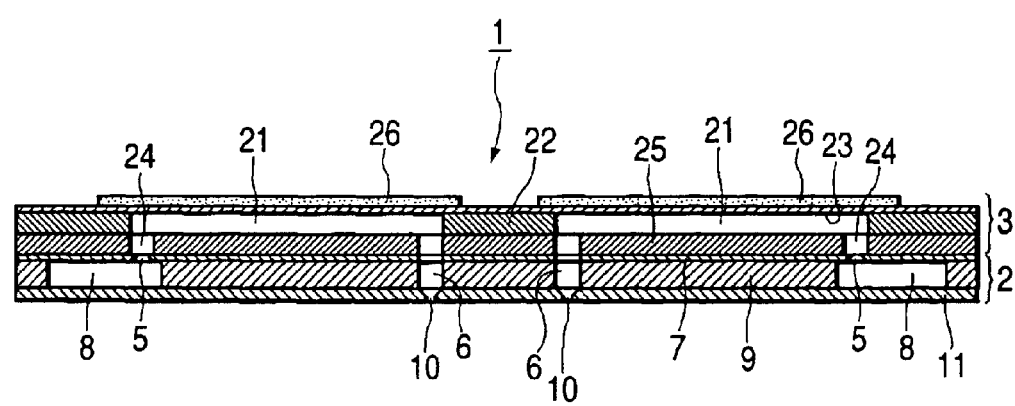
FIG. 2 is a section view for explaining an actuator unit and a flow passage unit.

The actuator unit 3 is a member which is also referred to as a head chip. As shown in FIG. 2, the actuator unit 3 is constituted by a pressure chamber formation substrate 22 provided with a through hole to be a pressure chamber 21, a vibration plate 23 for defining a part of the pressure chamber 21, a cover member 25 provided with a through hole to be a supply side communication port 24 and a through hole to be a part of the nozzle communication port 6, and a piezoelectric element 26 formed on the surface of the vibration plate 23 serving as a driving source. Referring to the thicknesses of these members 22, 23 and 25, the thicknesses of the pressure chamber formation substrate 22 and the cover member 25 are preferably 50 $\mu$m or more and more preferably 100 $\mu$m or more, and the thickness of the vibration plate 23 is preferably approximately 3 to 12 $\mu$m and 4 to 6 $\mu$m in the embodiment.

In the actuator unit 3, the pressure chamber formation substrate 22, the vibration plate 23 and the piezoelectric element 26 serve as the piezoelectric actuator according to the invention. Moreover, the vibration plate 23 and the piezoelectric element 26 constitute the piezoelectric actuator and the vibration plate 23 is a kind of support substrate provided with the piezoelectric element 26.

In order to fabricate the actuator unit 3, first of all, the cover member 25 is provided on one of the surfaces of the pressure chamber formation substrate 22 and the vibration plate 23 is provided on the other surface, and these members 22, 23 and 25 are integrated. The pressure chamber formation substrate 22, the vibration plate 23 and the cover member 25 are fabricated by ceramics such as alumina or zirconium oxide. For example, a green sheet (an unbaked sheet member) is subjected to a processing such as cutting or punching to form a necessary through hole. Thus, sheet-shaped precursors of the pressure chamber formation substrate 22, the vibration plate 23 and the cover member 25 are formed. By laminating and baking each of the sheet-shaped precursors, the sheet-shaped precursors are integrated to form one sheet-shaped member. The piezoelectric element 26 is formed for the baked sheet-shaped member so that a ceramics sheet is fabricated.

In this case, each sheet-shaped precursor and the piezoelectric element 26 are integrated by the baking. Therefore, a special bonding processing is not required. Moreover, it is also possible to obtain a high sealing property in the bonded surface of the members.

One ceramics sheet is provided with the pressure chambers 21 and the nozzle communication ports 6 for a plurality of units. In other words, the ceramics sheet becomes an actuator base member which has not been cut into the actuator units 3. For example, a plurality of chip regions to be actuator units 3 are set in a matrix in one ceramics sheet, and a necessary member such as the piezoelectric element 26 is formed in each of the chip regions. The ceramics sheet is then cut for each chip region. Consequently, a plurality of actuator units 3 are fabricated.

The pressure chamber 21 is an elongated hollow portion in a direction orthogonal to the nozzle row 12. A plurality of pressure chambers 21 are formed corresponding to the nozzle orifices 10. More specifically, as shown in FIG. 3, the pressure chambers 21 are arranged in the direction parallel to the nozzle row. One of the ends of each of the pressure chambers 21 communicates with the common ink reservoir 8 through the supply side communication port 24 and the ink supply port 5. Moreover, the other end of the pressure chamber 21 on the opposite side of the supply side communication port 24 communicates with the corresponding nozzle orifice 10 through the nozzle communication port 6. Furthermore, a part of the pressure chamber 21 (an upper surface) is defined by the vibration plate 23.

The piezoelectric element 26 is an element in a so-called flexible vibration mode, and is formed on the surface of the vibration plate 23 on the opposite side of the pressure chamber 21 for each pressure chamber 21. The piezoelectric element 26 takes the shape of an elongated block in the longitudinal direction of the pressure chamber 21. A plurality of piezoelectric elements 26 are arranged in the width-wise direction thereof. A proximal common electrode 27 constituting a part of the common electrode is extended in the direction of the nozzle row close to one of the ends in the longitudinal direction of the piezoelectric element 26. Moreover, supply terminals 28 are provided close to the other end in the longitudinal direction of the piezoelectric element 26. The supply terminal 28 is a member through which a contact terminal (not shown) of the wiring board 4 is electrically connected and is provided for each of the piezoelectric elements 26.

As shown in FIGS. 5A and 5B, the piezoelectric element 26 according to a first embodiment of the invention has a multilayer structure constituted by a piezoelectric layer 31, a branch common electrode 32 and a drive electrode 33. The piezoelectric layer 31 is interposed between the drive electrode 33 and the branch common electrode 32. The structure of the piezoelectric element 26 will be described below in detail.

A supply source (not shown) of the driving signal is electrically connected to the drive electrode 33 through the supply terminal 28, and the branch common electrode 32 is regulated to have a ground potential through the proximal common electrode 27, for example. When a driving signal is supplied to the drive electrode 33, an electric field having an intensity corresponding to a potential difference is generated between the drive electrode 33 and the branch common electrode 32. When the electric field is applied to the piezoelectric layer 31, the piezoelectric layer 31 is deformed corresponding to the intensity of the electric field. More specifically, when the electric potential of the drive electrode 33 is raised, the piezoelectric layer 31 contracts in a direction orthogonal to the electric field to deform the vibration plate 23 so as to decrease the volume of the pressure chamber 21. On the other hand, when the electric potential of the drive electrode 33 is reduced, the piezoelectric layer 31 expands in the direction orthogonal to the electric field to deform the vibration plate 23 so as to increase the volume of the pressure chamber 21.

The actuator unit 3 and the flow passage unit 2 are bonded to each other. For example, a sheet-shaped adhesive is provided between the supply port formation substrate 7 and the cover member 25, and the actuator unit 3 is then pressurized toward the flow passage unit 2 side to carry out bonding.

In the recording head 1 having the structure described above, a serial ink flow passage reaching the nozzle orifice 10 from the common ink reservoir 8 through the ink supply port 5, the supply side communication port 24, the pressure chamber 21 and the nozzle communication port 6 is formed for each nozzle orifice 10. In use, the ink passage is filled with ink (liquid ink, that is, a kind of liquid), and the corresponding pressure chamber 21 contracts or expands by flexing the piezoelectric element 26 so that the pressure of the ink in the pressure chamber 21 fluctuates. By controlling the ink pressure, an ink droplet can be ejected from the nozzle orifice 10. For example, when the pressure chamber 21 having a steady-state volume is caused to once expand and is caused to then contract rapidly, the ink is filled with the expansion of the pressure chamber 21 and the ink in the pressure chamber 21 is pressurized by a subsequent rapid contraction so that an ink droplet is ejected.

In order to stabilize an ejecting amount, an ejecting speed and an ejecting direction of the ink droplet, that is, to stabilize the ejecting characteristic of the ink droplet, it is necessary to maintain the volume of the pressure chamber 21 in a steady state (a steady-state volume) to be constant. The steady-state volume defines the expansion width of the pressure chamber 21. Therefore, if the steady-state volume fluctuates, the ejecting amount and the ejecting speed of the ink droplet are also varied. In order to stabilize the ejecting characteristic, it is preferable that the compliance of a deformed portion in the pressure chamber 21 (that is, the compliance of the whole vibration plate 23 and piezoelectric element 26) should be reduced to be influenced by a fluctuation in an ink pressure in a steady state with difficulty.

In order to eject the ink droplet at a high frequency, moreover, it is also preferable that the compliance of the deformed portion should be reduced. The reason is that a responsibility to the deformation of the piezoelectric element 26 is enhanced if the compliance is small. In order to withstand driving at a higher frequency, it is also necessary to more increase the rigidity of the piezoelectric element 26.

From these viewpoints, the piezoelectric element 26 having a multilayer structure is used in the embodiment. This respect will be described below.

First of all, the structure of the piezoelectric element 26 will be described in detail. As shown in FIGS. 5A and 5B, the block-shaped piezoelectric element 26 has a width W (see FIG. 7B) is almost equal to the width of the pressure chamber 21 and a length is slightly longer than that of the pressure chamber 21. The piezoelectric layer 31 is constituted by an upper piezoelectric layer (outer piezoelectric layer) 34 and a lower piezoelectric (inner piezoelectric layer) 35. Moreover, the branch common electrode 32 is constituted by an upper common electrode (outer common electrode) 36 and a lower common electrode (inner common electrode) 37. The branch common electrode 32 and the drive electrode 33 constitute an electrode layer.

The term "upper (outer)" or "lower (inner)" represents a positional relationship based on the vibration plate 23. More specifically, "upper (outer)" indicates a distant side from the vibration plate 23 and "lower (inner)" indicates a close side to the vibration plate 23.

The drive electrode 33 serves as a discrete electrode and is formed on a boundary between the upper piezoelectric layer 34 and the lower piezoelectric layer 35. Moreover, the upper common electrode 36 and the lower common electrode 37 constitute a common electrode together with the proximal common electrode 27. More specifically, the common electrode is pectinated into a plurality of branch common electrodes 32 (the upper common electrode 36 and the lower common electrode 37) which are extended from the proximal common electrode 27. The lower common electrode 37 is formed in the lower part of the lower piezoelectric layer 35 on the opposite side of the drive electrode 33 between the lower piezoelectric layer 35 and the vibration plate 23, and the upper common electrode 36 is formed in the upper part of the upper piezoelectric layer 34 on the opposite side of the drive electrode 33. More specifically, the piezoelectric element 26 has a multilayer structure in which the lower common electrode 37, the lower piezoelectric layer 35, the drive electrode 33, the upper piezoelectric layer 34 and the upper common electrode 36 are laminated from the vibration plate 26 side in this order.

The thickness of the piezoelectric layer 31 according to the embodiment is approximately 17 $\mu$m by summing two layers of the upper piezoelectric layer 34 and the lower piezoelectric layer 35 in a central part in a widthwise direction thereof. The whole thickness of the piezoelectric element 26 including the branch common electrode 32 is approximately 20 $\mu$m. More specifically, the lower common electrode 37 has a thickness of approximately 3 $\mu$m and the upper common electrode 36 has a thickness of approximately 0.3 $\mu$m. The upper common electrode 36 is made very thin in order to prevent a hindrance in the deformation of the piezoelectric element 26. The drive electrode 33 has a thickness of approximately 2 $\mu$m and is buried between the upper piezoelectric layer 34 and the lower piezoelectric layer 35.

In a conventional piezoelectric element having a single layer structure, the thickness of the whole element is approximately 15 m. In the embodiment, therefore, the compliance of a deformed portion is reduced corresponding to an increase in the thickness of the piezoelectric element 26. Consequently, a fluctuation in the volume of the pressure chamber 21 caused by a change in an ink pressure is suppressed, so that the deformed portion can be caused to follow even if the piezoelectric element 26 is driven at a high frequency.

The upper common electrode 36 and the lower common electrode 37 are regulated to have a constant potential, for example, a ground potential irrespective of a driving signal. The drive electrode 33 changes an electric potential in response to the supplied driving signal. Accordingly, electric fields having opposite directions to each other are generated between the drive electrode 33 and the upper common electrode 36 and between the drive electrode 33 and the lower common electrode 37 by the supply of the driving signal.

For a material constituting each of these electrodes, various conductors such as a single metal, an alloy and a mixture of electric insulating ceramics and a metal are selected, for example. It is required that a drawback such as a degeneration is not caused at a baking temperature. In the embodiment, gold is used for the upper common electrode 36 and platinum is used for the lower common electrode 37 and the drive electrode 33.

Both of the upper piezoelectric layer 34 and the lower piezoelectric layer 35 are fabricated by a piezoelectric material containing lead titanate zirconate (PZT) as a principal component, for example. The directions of polarization of the upper piezoelectric layer 34 and the lower piezoelectric layer 35 are opposite to each other. For this reason, the directions of expansion and contraction of the upper piezoelectric layer 34 and the lower piezoelectric layer 35 are uniform during the application of the driving signal so that the deformation can be carried out without a hindrance. More specifically, the upper piezoelectric layer 34 and the lower piezoelectric layer 35 flex the vibration plate 23 to decrease the volume of the pressure chamber 21 such that the electric potential of the drive electrode 33 is raised, and flex the vibration plate 23 to increase the volume of the pressure chamber 21 such that the electric potential of the drive electrode 33 is reduced.

In this case, the piezoelectric element 26 has the multilayer structure. Therefore, the electric field applied to each of the piezoelectric layers 34 and 35 is defined by a distance from the drive electrode 33 to the upper common electrode 36 or a distance from the drive electrode 33 to the lower common electrode 37. For this reason, a larger electric field than that of the piezoelectric element having a single layer structure can be applied to each of the piezoelectric layers 34 and 35 even if a driving voltage is identical. Consequently, the piezoelectric element 26 can be deformed efficiently so that the amount of deformation for an applied voltage can be enhanced.

In the embodiment, moreover, both ends in the longitudinal direction of the piezoelectric element 26 are extended outward beyond both ends in the longitudinal direction of the pressure chamber 21 in order to cause the volume of the pressure chamber in the steady state to be constant. More specifically, as shown in FIGS. 5A and 5B, both ends in the longitudinal direction of the lower piezoelectric layer 35 are formed in such a state as to be extended outward from the both ends in the longitudinal direction of the pressure chamber 21, and both ends in the longitudinal direction of the upper piezoelectric layer 34 are also formed in such a state as to be extended outward from both ends in the longitudinal direction of the pressure chamber 21. Both ends of the piezoelectric element 26 positioned on the outside in the longitudinal direction from the pressure chamber 21 (both ends of the piezoelectric layer 31 which will be hereinafter referred to as extended portions) are the non-deformed portions of the vibration plate 23 supported by the pressure chamber formation substrate 22 and the cover member 25 and are bonded to the vibration plate 23. In detail, they are integrated through an electrode layer such as the lower common electrode 37.

Thus, the extended portions are bonded in the non-deformed portion of the vibration plate 23. Therefore, the whole deformed portion of the pressure chamber 21 has a two-layer structure including the vibration plate 23 and the piezoelectric element 26. For this reason, the compliance of the deformed portion is further reduced and it is more difficult to be affected by a fluctuation in an ink pressure in the steady state. Accordingly, the volume of the pressure chamber 21 is defined by the amount of flexure of the piezoelectric element 26 and the volume can be controlled more precisely.

With such a structure, the deformed portion has a two-layer structure including the vibration plate 23 and the piezoelectric element 26 and is therefore deformed with difficulty. However, the piezoelectric element 26 has a multilayer structure and a necessary and sufficient amount of deformation can be therefore obtained.

In the embodiment, moreover, the shape of the piezoelectric element 26, particularly, the shape of the end in the longitudinal direction is elaborated so that the disconnection of an electrode is caused with difficulty. This respect will be described below in detail.

First of all, the upper common electrode 36 will be described. As shown in FIGS. 5A to 6B, the upper common electrode 36 and the lower common electrode 37 are extended outward in the longitudinal direction of the element and are electrically connected to each other in a position placed beyond the end of the piezoelectric element 26. More specifically, the lower common electrode 37 is extended on the surface of the vibration plate 23 up to a position in which the proximal common electrode 27 is formed, and the upper common electrode 36 is provided on the lower common electrode 37 through an end face in the longitudinal direction of the element of the upper piezoelectric layer 34 and an end face in the longitudinal direction of the element of the lower piezoelectric layer 35. In the embodiment, the upper common electrode 36 is also extended up to the position in which the proximal common electrode 27 is formed.

Accordingly, the upper common electrode 36 and the lower common electrode 37 are electrically connected to each other in a position placed beyond the end of the lower piezoelectric layer 35, that is, a non-deformed portion in the vibration plate 23. For this reason, a mechanical stress is applied with difficulty to the electrically connected portion of the upper common electrode 36 and the lower common electrode 37, so that the reliability of conduction can be maintained for a long time period. In the electrically connected region, moreover, the pressure chamber formation substrate 22 is positioned on the back side of the vibration plate 23 (that is, the opposite side of a surface on which the piezoelectric element is formed), thereby supporting the vibration plate 23. Therefore, the flatness of the vibration plate 23 can be set to be higher than a portion corresponding to the pressure chamber 21 so that both of the electrodes 36 and 37 can be formed uniformly, that is, without generating a defective portion. As a result, the conduction reliability of both of the electrodes 36 and 37 can be improved and a yield can be enhanced.

Referring to the upper common electrode 36 and the lower common electrode 37, a portion on the outside of the lower piezoelectric layer 35 serves as a common conductive section 38. The common conductive section 38 and the proximal common electrode 27 are electrically connected to each other. More specifically, a common potential is supplied to the branch common electrode 32 (36, 37) through the common conductive section 38. The common conductive section 38 is formed in the non-deformed portion of the vibration plate 23. Therefore, a conduction reliability with the proximal common electrode 27 can be maintained for a long time period. Furthermore, a plurality of piezoelectric elements 26 are arranged in the widthwise direction of the element as described above and the shapes of the common conductive sections 38 are identical to each other. For this reason, the proximal common electrode 27 can be constituted in a strip-shaped conductor pattern which is easily fabricated. Moreover, since a bent portion is not required in the proximal common electrode 27, a disconnection is caused with difficulty.

In the embodiment, referring to the shape of the piezoelectric layer 31 provided on the common conductive section 38 side, the longitudinal end of the lower piezoelectric layer 35 is extended outward from the longitudinal end of the upper piezoelectric layer 34. The reason is that the disconnection of the upper common electrode 36 is to be prevented. More specifically, the upper common electrode 36 is formed on the upper piezoelectric layer 34, and therefore, is to be also formed uniformly on the end face in the longitudinal direction of the element so as to be electrically connected to the lower common electrode 37.

Since the piezoelectric element 26 has a multilayer structure, the thickness of the whole element is larger than that of a conventional piezoelectric element having a single layer structure. Moreover, the upper common electrode 36 is very thin in order to efficiently deform the piezoelectric element 26. Therefore, when the end face of the upper piezoelectric layer 34 is aligned with that of the lower piezoelectric layer 35, it is hard to uniformly form the upper common electrode 36 on the end face if a method of applying an electrode material is not elaborated.

According to the above step-like structure, each vertical end face has a dimension equivalent to a single piezoelectric layer. In such a configuration, the upper common electrode 36 can be formed uniformly on any surfaces of the piezoelectric layers even if it is adopted a so-called printing method (thick film printing) in which a mask pattern is put from above the vibration plate 23 to apply an electrode material. Accordingly, the fabrication can be carried out by a simple method to increase a manufacturing efficiency while enhancing the reliability of conduction.

Next, the drive electrode 33 will be described. The drive electrode 33 is also extended outward in the longitudinal direction of the element (toward the opposite side of the common conductive section 38) and a portion provided on the outside of the lower piezoelectric layer 35 is set to be a drive conductive section 39. The drive conductive section 39 is extended up to a position in which the supply terminal 28 is formed, and is electrically connected to the supply terminal 28.

In the embodiment, a connection electrode 40 electrically connected to the supply terminal 28 is formed on the surface of the vibration plate 23, and the drive conductive section 39 is formed on the surface of the connection electrode 40. The reason is that the conduction reliability of the drive conductive section 39 and the supply terminal 28 is to be enhanced. More specifically, the outer end face of the lower piezoelectric layer 35 and the surface of the vibration plate 23 forms a corner portion which is apt to be insufficiently filled with an electrode material so that there is a possibility that a disconnection might be caused.

When the connection electrode 40 is previously formed on the surface of the vibration plate 23 and the drive electrode 33 is formed on the surface of the connection electrode 40 as in the embodiment, the drive electrode 33 and the supply terminal 28 are electrically connected to each other by a contact of the drive electrode 33 and the connection electrode 40. Consequently, the reliability of the conduction can be further enhanced.

The connection electrode 40 may be extend at least up to the longitudinal end portion of the lower piezoelectric layer 35 in order to obtain the above-described advantages. In this embodiment, the tip end of the connection electrode 40 is extended beyond the longitudinal end face of the lower piezoelectric layer 35 while providing an insulating region X with respect to the lower common electrode 37, so that they are electrically insulated from each other.

Thus, a part of the connection electrode 40 is formed between the lower piezoelectric layer 35 and the vibration plate 23 in consideration of a tolerance of the position in which each piezoelectric element 26 is to be formed. More specifically, the piezoelectric element 26 is fabricated by a printing method using a mask. For example, an electrode material to be the lower common electrode 37 is printed in a predetermined pattern on the surface of the vibration plate 23 and is then baked. Next, a piezoelectric material to be the lower piezoelectric layer 35 is printed and baked to be provided on the lower common electrode 37. In the same procedure, subsequently, the drive electrode 33, the upper piezoelectric layer 34 and the upper common electrode 36 are printed and baked sequentially.

Thus, the piezoelectric element 26 is formed by a printing method. For this reason, a slight variation (tolerance) is generated in a position in which the longitudinal end face of the lower piezoelectric layer 35 is to be formed. In the embodiment, since there is employed a structure in which a part of the connection electrode 40 is formed between the lower piezoelectric layer 35 and the vibration plate 23, the drive electrode 33 and the connection electrode 40 are electrically connected to each other reliably even if a position in which the lower piezoelectric layer 35 is to be formed is varied slightly.

While the connection electrode 40 can be formed by various electrode materials, it is preferable that the same electrode material as that of the lower common electrode 37 should be used. The reason is that a manufacturing efficiency is to be enhanced. As described above, the piezoelectric element 26 is fabricated by repetitively printing and baking an electrode material and a piezoelectric material. When the connection electrode 40 is formed by the same electrode material as the material of the lower common electrode 37, the formation of the lower common electrode 37 and that of the connection electrode 40 can be carried out at a time. More specifically, the pattern of the lower common electrode 37 and that of the connection electrode 40 are formed into one pattern. Consequently, it is possible to collectively fabricate the lower common electrode 37 and the connection electrode 40 at the same step. Accordingly, the manufacturing efficiency can be enhanced.

In the embodiment, moreover, there is employed a structure in which the formation ranges of the branch common electrode 32 and the drive electrode 33 and a shape in the widthwise direction of the piezoelectric element 26 are elaborated to enhance a deformation efficiency. This respect will be described below in detail.

First, the formation ranges of the branch common electrode 32 and the drive electrode 33 will be described. In the embodiment, each of the drive electrode 33, the upper common electrode 36 and the lower common electrode 37 is extended so as to cover the pressure chamber 21 in a longitudinal direction. In other words, as shown in FIGS. 5A to 6B, the drive electrode 33 has a length set to be larger than the length of the pressure chamber 21 and is extended up to a position beyond the end face of the pressure chamber 21 on the distant side from the supply terminal 28 (the drive conductive section 39). Moreover, the upper common electrode 36 and the lower common electrode 37 have lengths set to be larger than the length of the pressure chamber 21 and are extended up to a position beyond the end face of the pressure chamber 21 on the distant side from the proximal common electrode 27 (the common conductive section 38). Consequently, the pressure chamber 21 is positioned in a region in which these electrodes are superposed, that is, on the inside of an active region LA in which the piezoelectric layer 31 can be deformed. In other words, the pressure chamber 21 is brought into a superposed state within the range of the active region LA seen in the direction of lamination of the electrodes.

When the pressure chamber 21 is thus positioned within the range of the active region LA, the deformed portion is flexed wholly (that is, in a portion defining the pressure chamber 21). In other words, the deformed portion is flexed within the pressure chamber 21 on the inside of the non-deformed portion of the vibration plate 23. Consequently, the amount of a change in the volume of the pressure chamber 21 can be increased as much as possible, thereby contributing to an increase in the ejected amount of an ink droplet and the ejectability of ink having a high viscosity.

While both the upper common electrode 36 and the lower common electrode 37 are formed so as to cover the pressure chamber 21 in the longitudinal direction in this embodiment, at least one of the electrodes may be formed so as to cover the pressure chamber 21 in the longitudinal direction. Moreover, while each of the electrodes is extended beyond the end face of the pressure chamber 21, the same advantages can be produced if each of the electrodes is formed up to such a position as to be at the level of the end face of the pressure chamber 21 as seen in the direction of lamination of the electrodes.

Next, description will be given to a shape in the widthwise direction of the piezoelectric element 26. The embodiment has a feature that the thickness of a widthwise end region positioned on the outside in the widthwise direction of the drive electrode 33 is set to be smaller than that of a widthwise central region positioned in the width of the drive electrode 33.

Figure 7A:
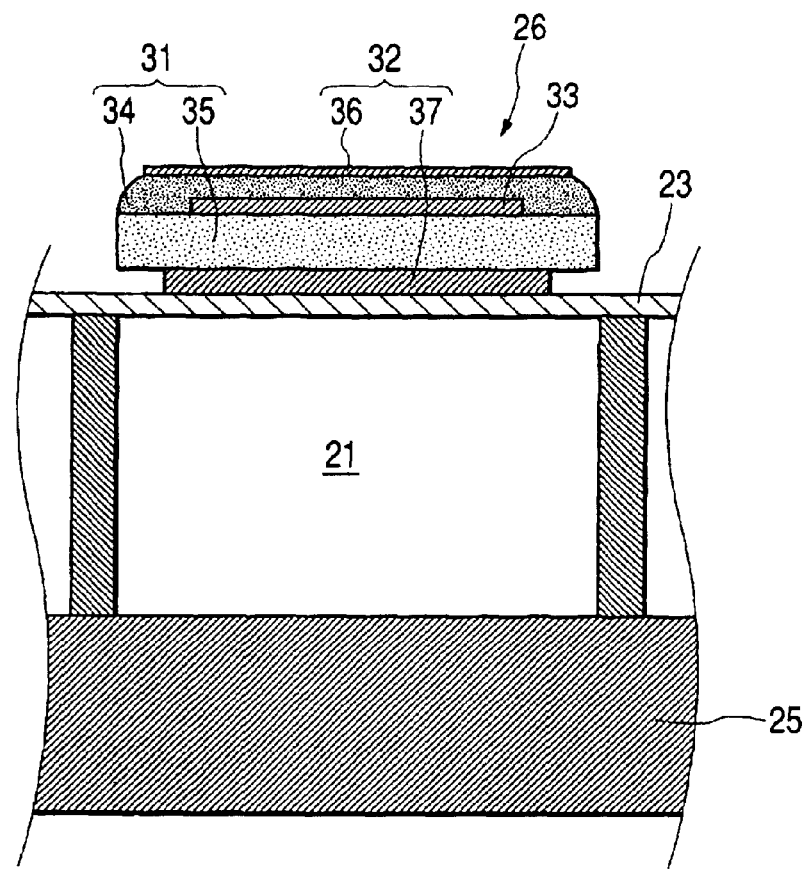
FIG. 7A is a section view of the piezoelectric element along with a widthwise direction thereof.

FIG. 7A is a section view showing the piezoelectric element 26 along with the widthwise direction of an electrode (a shorter direction). In the piezoelectric element 26, the lower common electrode 37 is covered beyond an overall width thereof by the lower piezoelectric layer 35 and the drive electrode 33 is covered beyond an overall width thereof by the upper piezoelectric layer 34. Accordingly, the drive electrode 33 is almost buried in both of the piezoelectric layers 34 and 35. Moreover, the lower piezoelectric layer 35 having an electrical insulating property is present between the drive electrode 33 and the lower common electrode 37. Therefore, it is also possible to reliably prevent a short circuit of the drive electrode 33 and the lower common electrode 37.

Figure 7B:
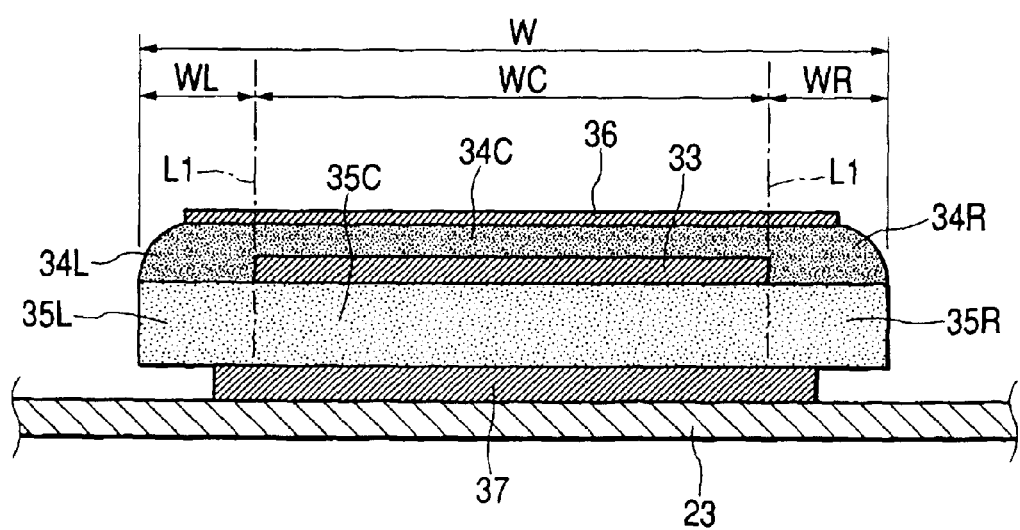
FIG. 7B is an enlarged view of FIG. 7A.

In the piezoelectric element 26, as shown in FIG. 7B, the thicknesses of widthwise end regions WL and WR positioned on the outside of the drive electrode 33 in a widthwise direction are set to be smaller than the thickness of a widthwise central region WC positioned within the width of the drive electrode 33. The widthwise central region WC represents a portion within the range of a pair of first virtual lines L1 set in a vertical direction from both widthwise ends of the drive electrode 33 respectively. Moreover, the widthwise end regions WL and WR represent portions provided on the outside of the first virtual lines L1 in the widthwise direction. In FIG. 7B, a left portion of the widthwise central region WC is represented by a left widthwise end region WL and a right portion of the widthwise central region WC is represented by a right widthwise end region WR.

If the thickness of an upper left end region 34L and that of an upper right end region 34R are set to be smaller than the thickness of an upper widthwise central region 34C and the thickness of a lower left end region 35L and that of a lower right end region 35R are set to be smaller than the thickness of a lower widthwise central region 35C, stresses of the piezoelectric layers 34 and 35 in the widthwise end regions WL and WR are smaller than those of the piezoelectric layers 34 and 35 in the widthwise central region WC. Consequently, the widthwise end region WL and WR portions are flexed more easily than the widthwise central region WC portion so that the piezoelectric element 26 can be deformed efficiently.

The invention is not limited to this embodiment but various modifications can be made based on the description of appended claims.

Figure 8A:
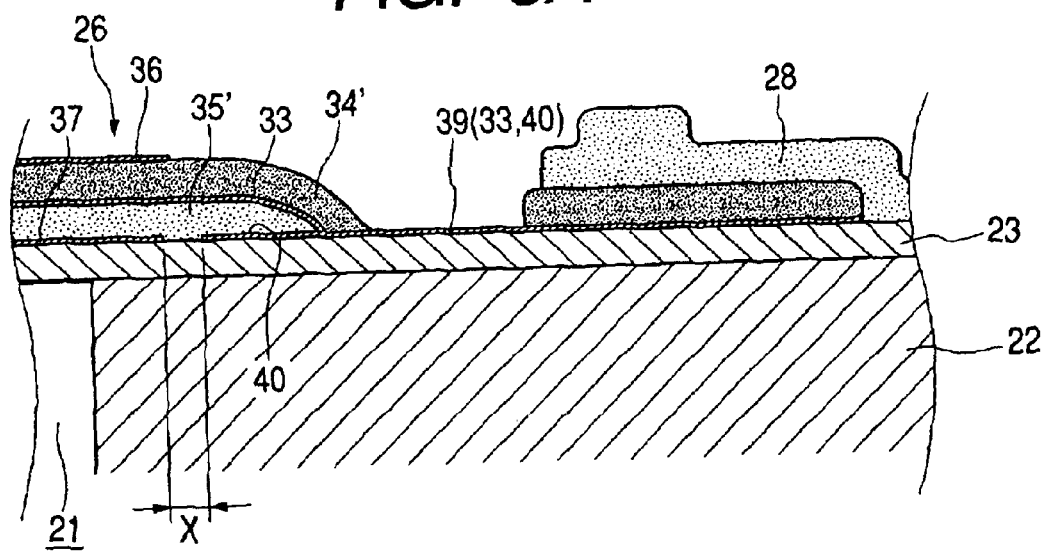
FIG. 8A is a partial enlarged section view showing the structure of the end of a piezoelectric element on the supply terminal side, according to a second embodiment of the invention.
Figure 8B:
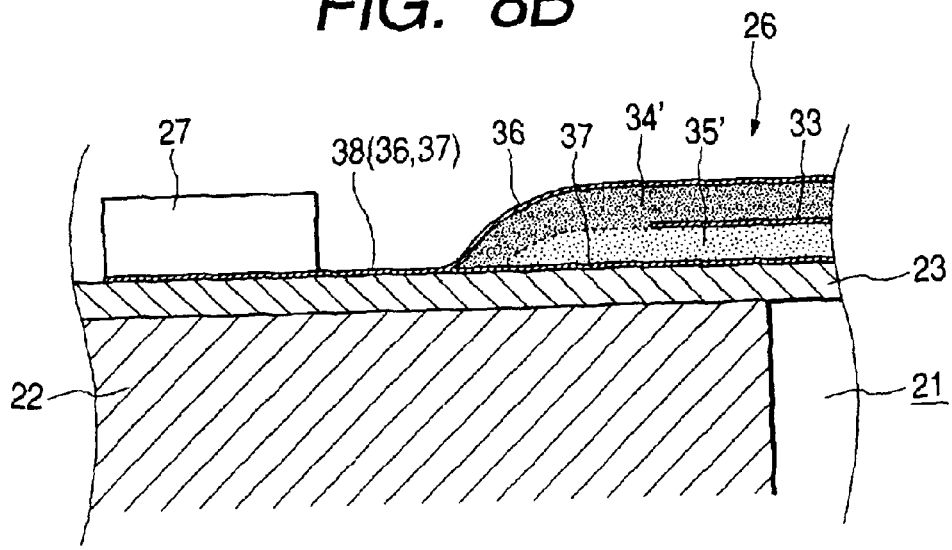
FIG. 8B is a partial enlarged section view showing the structure of the end of the piezoelectric element on the proximal common electrode side, according to the second embodiment.

For example, according to a second embodiment shown in FIGS. 8A and 8B, the overall length of an upper piezoelectric layer 34' may be set to be larger than that of a lower piezoelectric layer 35' so that the lower piezoelectric layer 35' is covered with the upper piezoelectric layer 34' beyond both longitudinal ends thereof.

In such a structure, the surface of the end of the upper piezoelectric layer 34' constitutes a relatively gentle slope (a curved surface) at the common conductive section 38 side. More specifically, since a step portion is hard to be generated over a surface on which the upper common electrode 36 is formed, the upper common electrode 36 can be provided smoothly. Consequently, the upper common electrode 36 can be provided uniformly on the surface of the end of the upper piezoelectric layer 34' so that a defective portion can be prevented from being generated and the reliability of manufacture can be enhanced. In order to make the fact that the surface of the end of the upper piezoelectric layer 34' smooth, it is preferable that the thickness of the lower piezoelectric layer 35' is reduced toward the longitudinal end thereof.

On the other hand, the upper piezoelectric layer 34' covers the drive electrode 33 in a place in which a connection electrode 40 and the drive electrode 33 are superposed (more specifically, at a place positioned just beyond the lower piezoelectric layer 35'). Consequently, the end portion of the upper piezoelectric layer 34' also serves as the protective layer of the drive electrode 33 to prevent the drive electrode 33 from being deteriorated or stripped. Thus, the conduction state of the drive electrode 33 and the connection electrode 40 can be set more reliably. Similarly, it is preferable that the thickness of the lower piezoelectric layer 35' is reduced toward the longitudinal end thereof. The reason is that the drive electrode 33 and the connection electrode 40 are to be electrically connected surely. More specifically, the end of the lower piezoelectric layer 35' is gradually thinned so that the end face of the lower piezoelectric layer 35' becomes a smooth slope and the drive electrode 33 can easily be provided thereon uniformly. Consequently, the reliability of manufacture can be enhanced.

Figure 9A:
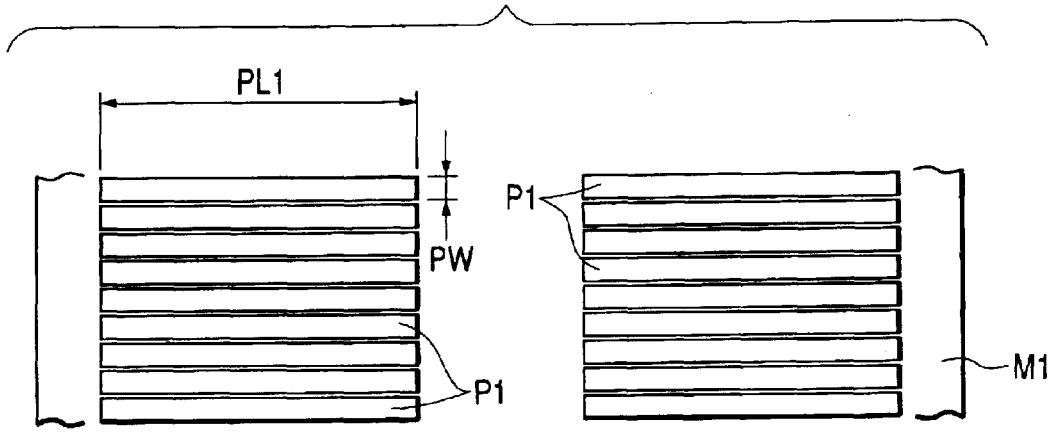
FIGS. 9A and 9B are views for explaining masks to be used in the fabrication of the piezoelectric element of the second embodiment.
Figure 9B:
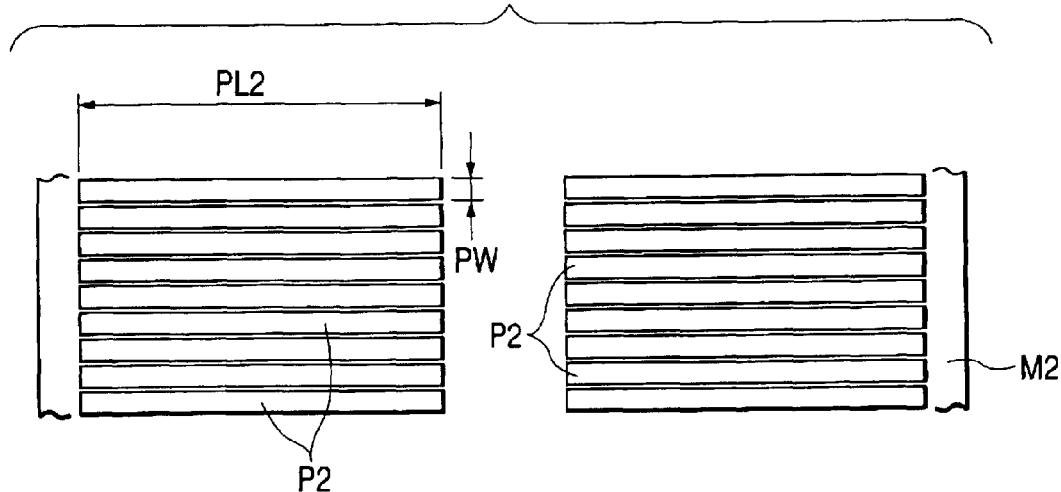

In order to fabricate the piezoelectric element 26 according to the variant, it is convenient that two kinds of masks having different shapes of a print pattern (that is, an opening) are used. For example, as shown in FIGS. 9A and 9B, there are used a first mask M1 having a plurality of elongated print patterns P1 corresponding to the lower piezoelectric layer 35' and a second mask M2 having a plurality of elongated print patterns P2 corresponding to the upper piezoelectric layer 34'.

The print pattern P1 is a rectangular (elongated band-shaped) opening having a length PL1 set to be a length in the longitudinal direction of the element of the lower piezoelectric layer 35' and a width PW set to be the width of the piezoelectric element 26. A plurality of print patterns P1 are arranged in a widthwise direction thereof. Moreover, the print pattern P2 is a rectangular opening having a length PL2 set to be a length in the longitudinal direction of the element of the upper piezoelectric layer 34' and a width PW set to be the width of the piezoelectric element 26. In other words, the print pattern P2 is a rectangular opening having a length PL2 set to be larger than the length PL1 of the print pattern P1 and the width PW set to be equal to the width of the print pattern P1. A plurality of print patterns P2 are arranged in a widthwise direction thereof in the same manner as the print pattern P1.

Next, description will be given to a procedure for fabricating the piezoelectric element 26 according to the second embodiment by using these masks M1 and M2.

First, the lower common electrode 37 is formed into a baked sheet-shaped member at a lower common electrode forming step. For example, a mask provided with a print pattern for the lower common electrode 37 and the connection electrode 40 is mounted on the surface of a vibration plate in the baked sheet-shaped member and a paste-like electrode material is applied onto the surface of the vibration plate through the same mask. When the electrode material is applied, it is baked to form the lower common electrode 37 and the connection electrode 40.

After the lower common electrode 37 and the connection electrode 40 are formed, a lower piezoelectric layer forming step is executed to form a lower piezoelectric layer 35. At the lower piezoelectric layer forming step, the first mask M1 is mounted in such a manner that the print pattern P1 is superposed on the electrodes 37 and 40 and a paste-like piezoelectric material is applied through the mask M1. When the piezoelectric material is applied onto these electrodes 37 and 40, it is baked to form the lower piezoelectric layer 35'.

After the lower piezoelectric layer 35' is formed, a drive electrode forming step is executed to form the drive electrode 33. At the drive electrode forming step, a mask is mounted in such a manner that a print pattern for a drive electrode is superposed on the lower piezoelectric layer 35' and a paste-like electrode material is applied through the same mask. When the electrode material is applied onto the lower piezoelectric layer 35', it is baked to form the drive electrode 33.

After the drive electrode 33 is formed, an upper piezoelectric layer forming step is executed to form the upper piezoelectric layer 34'. At the upper piezoelectric layer forming step, the second mask M2 is mounted in such a manner that both ends in the longitudinal direction of the lower piezoelectric layer 35' are placed on the inside in the longitudinal direction of the print pattern P2 and a paste-like piezoelectric material is applied through the mask M2. More specifically, both ends in the longitudinal direction of the lower piezoelectric layer 35' are covered to be buried with the applied piezoelectric material. When the piezoelectric material is applied, it is baked to form the upper piezoelectric layer 34'.

Subsequently, the upper common electrode 36, the proximal common electrode 27 and the supply terminal 28 are formed in the same procedure. In this case, both ends in the longitudinal direction of the lower piezoelectric layer 35' are covered with the upper piezoelectric layer 34'. As described above, therefore, the surfaces of both ends of the upper piezoelectric layer 34' are relatively smooth and the upper common electrode 36 can be provided uniformly (without a defect in a necessary portion). Moreover, since the drive electrode 33 is covered from above, the reliability of the electrical conduction of the drive electrode 33 and the connection electrode 40 can be enhanced.

Figure 10A:
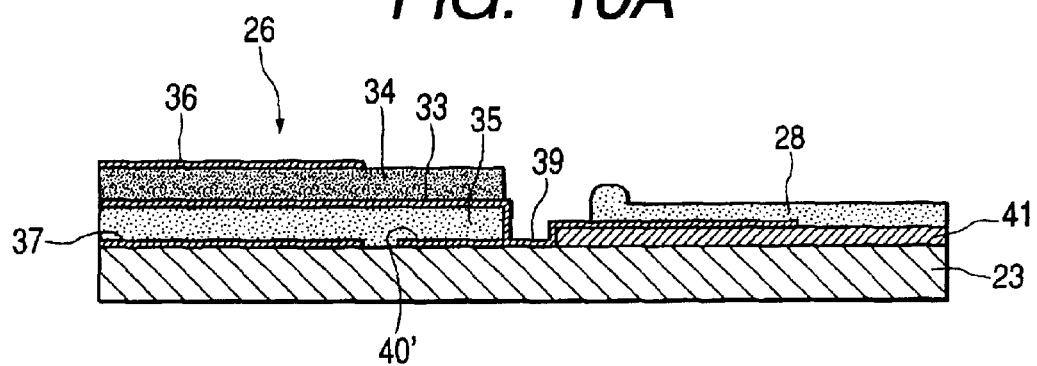
FIG. 10A is a partial enlarged section view showing the structure of the end of a piezoelectric element on the supply terminal side, according to a third embodiment of the invention.

As shown in FIG. 10A, according to a third embodiment of the invention, the supply terminal 28 and a portion of a connection electrode 40' closer to the supply terminal 28 may be formed on a terminal substrate 41. In this case, it is preferable that the terminal substrate 41 is fabricated by a baking material having a conductivity, for example, a silver paste.

Furthermore, at the supply terminal 28 side, the end face of the upper piezoelectric layer 34 may be made flush with that of the lower piezoelectric layer 35.

Figure 10B:
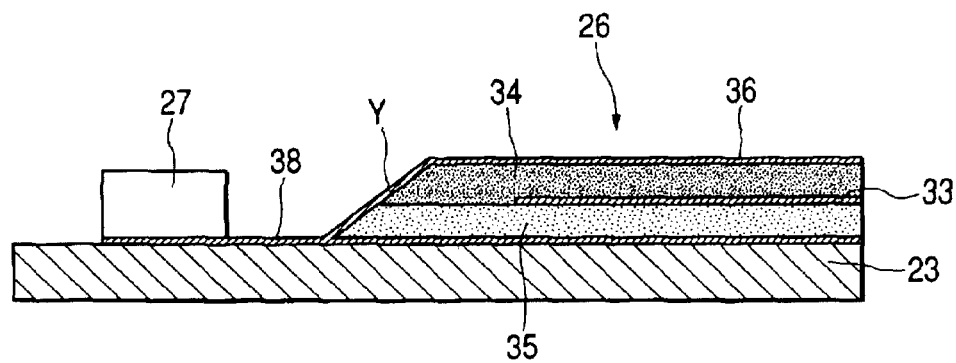
FIG. 10B is a partial enlarged section view showing the structure of the end of a piezoelectric element on the proximal common electrode side, according to a fourth embodiment of the invention.

As shown in FIG. 10B, according to a fourth embodiment of the invention, a longitudinal end face of the lower piezoelectric layer 35 at the proximal common electrode 27 (the common conductive section 38) side and that of the upper piezoelectric layer 34 may form a continuous slope Y. By such a structure, an uneven portion (or a step), which is to be the factor of a disconnection is apt to be generated, is hardly to be formed. Consequently, the upper common electrode 36 can easily be formed uniformly over the slope Y. Accordingly, the disconnection of the drive conductive section 38 (the upper common electrode 36) can be prevented.

The description has been given by taking, as an example, the recording head 1 to be a kind of liquid jetting head. The invention can also be applied to other liquid jetting heads such as a liquid crystal jetting head and a coloring material jetting head or a piezoelectric actuator and a piezoelectric element which are used in these liquid jetting heads. Moreover, the invention can also be applied to a piezoelectric actuator and a piezoelectric element which are used in various devices such as a micropump.

What is claimed is:

1. A piezoelectric actuator, comprising:

a substrate, formed with a chamber having an opening which is defined by first edges extending in a first direction with a first dimension and second edges extending in a second direction perpendicular to the first direction with a second dimension shorter than the first dimension;

a vibration plate, provided on the substrate so as to seal the opening;

a first common electrode, formed on the vibration plate and to be fixed at a predetermined potential;

a first piezoelectric layer, laminated on the first common electrode so as to oppose the chamber, the first piezoelectric layer extending in the first direction such that both end portions thereof in the first direction are beyond the second edges of the opening;

a drive electrode, laminated on the first piezoelectric layer, to which a drive signal is supplied externally;

a second piezoelectric layer, laminated on the drive electrode so as to oppose the chamber, the second piezoelectric layer extending in the first direction such that both end portions thereof in the first direction extend beyond the second edges of the opening; and a second common electrode, laminated on the second piezoelectric layer and to be fixed at the predetermined potential, wherein:

the first common electrode and the second common electrode are extended beyond one of the second edges in the first direction and electrically connected at a first region; and a length in which the first piezoelectric layer extends beyond one of the second edges toward the first region is longer than a length in which the second piezoelectric layer extends beyond the one of the second edges toward the first region.

2. The piezoelectric actuator, as set forth in claim 1, wherein one end face of the first piezoelectric layer extended beyond the one of the second edges and one end face of the second piezoelectric layer extended beyond the one of the second edges form a continuous slope.

3. A piezoelectric actuator, comprising:

a substrate, formed with a chamber having an opening which is defined by first edges extending in a first direction with a first dimension and second edges extending in a second direction perpendicular to the first direction with a second dimension shorter than the first dimension;

a vibration plate, provided on the substrate so as to seal the opening;

a first common electrode, formed on the vibration plate and to be fixed at a predetermined potential;

a first piezoelectric layer, laminated on the first common electrode so as to oppose the chamber;

a drive electrode, laminated on the first piezoelectric layer, to which a drive signal is supplied externally;

a second piezoelectric layer, laminated on the drive electrode so as to oppose the chamber, the second piezoelectric layer extending in the first direction such that each of end portions thereof in the first direction extends beyond an associated end portion in the first direction of the first piezoelectric layer; and a second common electrode, laminated on the second piezoelectric layer and to be fixed at the predetermined potential.

4. The piezoelectric actuator as set forth in claim 3, wherein a thickness of each end portion in the first direction of the first piezoelectric layer is gradually reduced toward each end thereof.

5. The piezoelectric actuator as set forth in claim 3, wherein the first piezoelectric layer and the second piezoelectric layer extend in the first direction such that both end portions thereof in the first direction are beyond the second edges of the opening.

6. The piezoelectric actuator as set forth in claim 1 or 3, wherein the drive electrode extends in the first direction beyond one of the second edges.

7. The piezoelectric actuator as set forth in claim 6, further comprising a connection electrode, formed on the vibration plate and electrically connected to the drive electrode at a portion where is outer than one of the second edges, wherein the drive signal is supplied to the drive electrode via the connection electrode.

8. The piezoelectric actuator as set forth in claim 7, wherein a part of the connection electrode is covered by the first piezoelectric layer.

9. The piezoelectric actuator as set forth in claim 7, wherein the first common electrode and the connection electrode are comprised of an identical conductive material.

10. The piezoelectric actuator as set forth in claim 1 or 3, wherein the drive electrode, and at least one of the first common electrode and the second common electrode extend in the first direction such that both end portions thereof in the first direction are at least up to the second edges of the opening.

11. The piezoelectric actuator as set forth in claim 1 or 3, wherein:

a length in the second direction of the first piezoelectric layer is longer than a length in the second direction of the first common electrode;

a length in the second direction of the second piezoelectric layer is longer than a length in the second direction of the drive electrode; and a thickness of each end portion in the second direction of at least one of the first piezoelectric layer and the second piezoelectric layer is thinner than a thickness of a center portion thereof in the second direction.

12. The piezoelectric actuator as set forth in claim 1 or 3, wherein a plurality of piezoelectric elements each including the first common electrode, the first piezoelectric layer, the drive electrode, the second piezoelectric layer and the second common electrode are arranged in the second direction.

13. The piezoelectric actuator as set forth in claim 12, wherein further comprising a proximal common electrode extending in the second direction, to which the first common electrode and the second common electrode in each of the piezoelectric elements are electrically connected.

14. A liquid jetting head, comprising the piezoelectric actuator set forth in claim 1 or 3 such that the vibration plate is deformed to cause pressure fluctuation in liquid contained in the chamber to eject a liquid droplet from a nozzle orifice communicated with the chamber.

15. A piezoelectric element, comprising:

a first common electrode, to be fixed at a predetermined potential;

a first piezoelectric layer, laminated on the first common electrode and extending in a first direction;

a drive electrode, laminated on the first piezoelectric layer, to which a drive signal is supplied externally;

a second piezoelectric layer, laminated on the drive electrode and extending in the first direction such that each of end portions thereof in the first direction extends beyond an associated end portion in the first direction of the first piezoelectric layer; and a second common electrode, laminated on the second piezoelectric layer and to be fixed at the predetermined potential.

16. The piezoelectric element as set forth in claim 15, wherein a thickness of each end portion in the first direction of the first piezoelectric layer is gradually reduced toward each end thereof.

* * * * *